(12) United States Patent
Quax et al.

(10) Patent No.: US 12,205,942 B2
(45) Date of Patent: Jan. 21, 2025

(54) CONDUCTIVITY REDUCING FEATURES IN AN INTEGRATED CIRCUIT

(71) Applicant: NXP B.V., Eindhoven (NL)

(72) Inventors: Guido Wouter Willem Quax, Wijchen (NL); Dongyong Zhu, Shanghai (CN); Feng Cong, Shanghai (CN); Tingting Pan, Shanghai (CN)

(73) Assignee: NXP B.V., Eindhoven (NL)

( * ) Notice: Subject to any disclaimer, the term of this patent is extended or adjusted under 35 U.S.C. 154(b) by 496 days.

(21) Appl. No.: 17/374,214

(22) Filed: Jul. 13, 2021

(65) Prior Publication Data

US 2022/0375923 A1    Nov. 24, 2022

(30) Foreign Application Priority Data

May 24, 2021    (CN) .......................... 202110568267.0

(51) Int. Cl.
*H01L 27/02*    (2006.01)

(52) U.S. Cl.
CPC ...... *H01L 27/0248* (2013.01); *H01L 27/0262* (2013.01)

(58) Field of Classification Search
CPC .................................................. H01L 27/0248
See application file for complete search history.

(56) References Cited

U.S. PATENT DOCUMENTS

| | | | |
|---|---|---|---|
| 5,793,066 A | 8/1998 | Ajit | |
| 5,831,313 A | 11/1998 | Han et al. | |
| 7,345,345 B2 | 3/2008 | Ando et al. | |
| 7,348,643 B2 | 3/2008 | Boselli et al. | |
| 7,566,595 B2 | 7/2009 | Steinhoff | |
| 10,411,095 B2 | 9/2019 | Toshioka | |
| 2015/0236090 A1* | 8/2015 | Ritter | H01L 29/1008 257/547 |
| 2019/0123555 A1* | 4/2019 | Kim | H01L 27/0255 |

(Continued)

FOREIGN PATENT DOCUMENTS

EP    2908346 A1    8/2015

OTHER PUBLICATIONS

Cerati, L., "Novel Technique to Reduce Latch-up Risk due to ESD Protection Devices in Smart Power Technologies", 2006 Electrical Overstress/Electrostatic Discharge Symposium, Sep. 10-15, 2006.

(Continued)

*Primary Examiner* — Joshua Benitez Rosario
*Assistant Examiner* — Scott E Bauman
(74) *Attorney, Agent, or Firm* — David G. Dolezal (57) ABSTRACT

An integrated circuit includes two N wells from two different devices in close proximity to each other with each N well biased by two different terminals. The N wells are at least partially surrounded by P type regions that are biased by a terminal. The integrated circuit includes conductivity reduction features that increase the resistivity of current paths to a P type regions of one device on a side closest the other device. The integrated circuit includes two conductive tie biasing structures each located directly over an N type region of the substrate and directly over a P type region of the substrate. The two conductive tie biasing structures are not electrically connected to each other and are not electrically coupled to each other by a conductive biasing structure.

20 Claims, 8 Drawing Sheets

(56) References Cited

U.S. PATENT DOCUMENTS

2019/0206858 A1\*  7/2019  Lin .................... H01L 27/027
2021/0104513 A1\*  4/2021  Kocon ................ H01L 29/402
2021/0104514 A1\*  4/2021  Kocon ................ H01L 27/0262
2022/0223584 A1\*  7/2022  Appaswamy ....... H01L 29/0692

OTHER PUBLICATIONS

Salman, A., "Solutions to mitigate parasitic NPN bipolar action in high voltage analog technologies", Electrical Overstress/Electrostatic Discharge Symposium Proceedings, Oct. 3-8, 2010.
Tsai, M., "Investigation and Solution to the Early Failure of Parasitic NPN Triggered by the Adjacent PNP ESD Clamps", 2015 37th Electrical Overstress/Electrostatic Discharge Symposium (EOS/ESD), Sep. 27-Oct. 2, 2015.

\* cited by examiner

CONDUCTIVITY REDUCING FEATURES IN AN INTEGRATED CIRCUIT

BACKGROUND OF THE INVENTION

Field of the Invention

This invention relates in general to integrated circuits including ESD devices.

Description of the Related Art

In some integrated circuits, parasitic NPN transistors can form when two N wells in close proximity are biased by two different pads. In certain applications (e.g. for voltage applications greater than 15V), the parasitic NPN transistor can lead to a failure (e.g. from filament formation) in the parasitic NPN transistor during an ESD event.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an integrated circuit includes two N wells from two different devices in close proximity to each other with each N well biased by two different terminals. The N wells are at least partially surrounded by P type regions that are biased by a terminal. The integrated circuit includes conductivity reduction features that increase the resistivity of current paths to a P type region of one device on a side closest the other device. In some embodiments, such current reduction features add a resistance to the base electrode of a parasitic NPN transistor in the substrate, where the emitter electrode and collector electrode of the parasitic NPN transistor are the two N wells. Also, the integrated circuit includes conductive tie biasing structures where the conductive tie biasing structures are not electrically connected to each other or electrically coupled to each other by another conductive biasing structure. One of the conductive tie biasing structures is located between the two devices. Not electrically connecting the conductive tie biasing structures together or electrically coupling the two tie biasing structures together with a conductive biasing structure also adds to the resistance of the base electrode of the parasitic NPN transistor. During an ESD event, the added resistance in the base electrode reduces the base/emitter current of the parasitic NPN transistor, thereby inhibiting the flow of current between the two wells through the parasitic NPN transistor.

Figure 1:
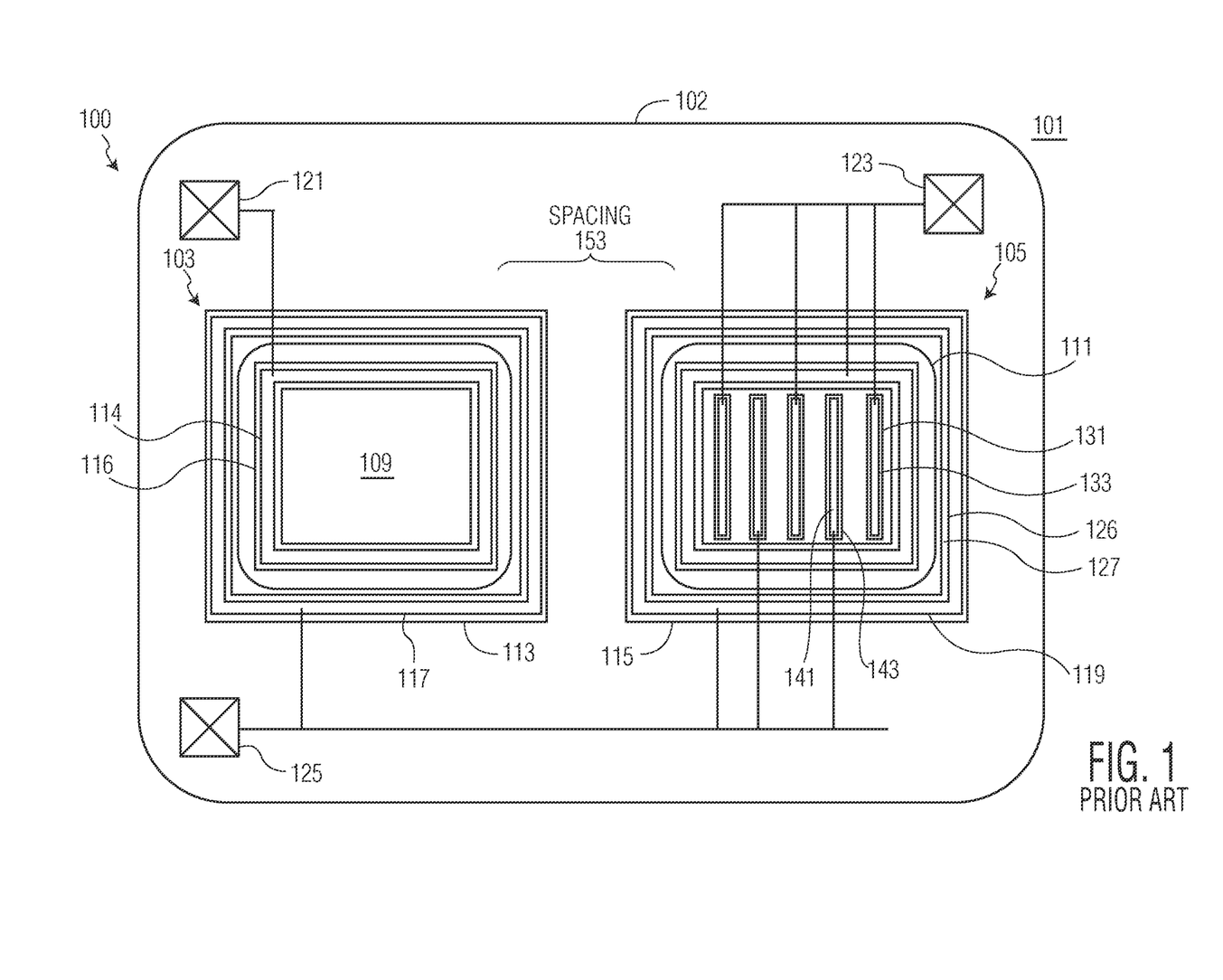
FIG. 1 is a partial top view of a prior art integrated circuit.

FIG. 1 is a partial top view of a prior art integrated circuit 100. The view of FIG. 1 shows two devices 103 and 105 located in a semiconductor substrate 101 with a P well 102. Device 103 may be an N well of PNP transistor. Device 105 is a PNP transistor that is utilized for discharging current from an Electrostatic Discharge (ESD) event involving pad 123. In one example, an ESD event may occur from a sudden flow of current between two electrically charged objects cause by their unintentional contact (e.g. an electrical short) or from a dielectric breakdown. However, an ESD event may be cause by other factors. For example, an ESD event may be caused by a human (a charged object) touching one pad (e.g. 123) and the other pad (e.g. 121) being grounded.

Device 103 includes an N well 109 located in substrate 101. N well 109 is biased from a pad 121 located above the substrate 101 that is electrically connected (via an interconnect) to a conductive biasing structure 114 located on a N+ contact region 116 for biasing well 109. A P+ contact region 113 in substate 101 surrounds N well 109 and is biased by ground pad 125 that is located over substrate 101 and connected to conductive biasing structure 117, which is connected to P+ contact region 113. The portion of P well 102 in proximity to P+ contact region 113 serves as an anode for a parasitic diode of device 103 and N well 109 serves as the cathode.

Device 105 is a PNP transistor for discharging ESD current from pad 123 during an ESD event. N well 111 forms the base of the PNP transistor and is biased by pad 123 which is connected to conductive biasing structure 127, which is connected to N+ contact region 126 in substrate 101. N well 111 is spaced apart from N well 109 by a spacing 153. The emitter of the PNP transistor of device 105 is formed by P+ emitter finger regions (131) in substrate 101 that are biased by pad 123 through a conductive biasing structure (133) located on the P+ emitter figure region (131). The collector of the PNP transistor of device 105 is formed by P+ collector finger regions (143) in substrate 101 that are biased by pad 125 through a conductive biasing structure (141) located on the P+ collector region (143). An isolation P+ region 115 in substrate 101 surrounds N well 111 and is bias by ground pad 125 through conductive biasing structure 119 located on region 115.

Figure 2:
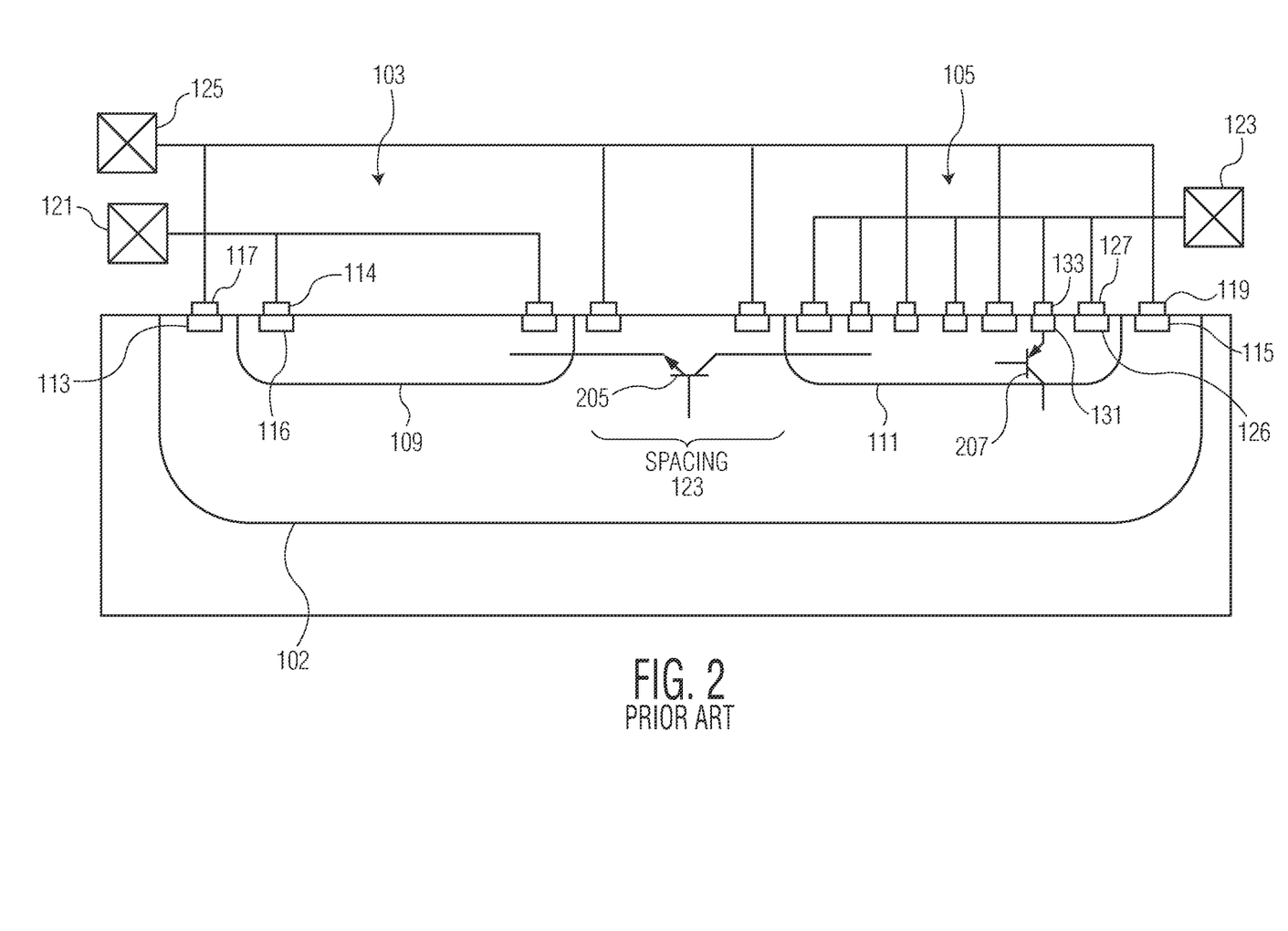
FIG. 2 is a partial cutaway side view of a prior art integrated circuit.

Referring to FIG. 2, N well 109, N well 111, and P well 102 form a parasitic NPN transistor 205 where N well 111 is the collector, P well 102 is the base, and N well 109 is the emitter. The strength of the parasitic transistor 205 is dependent upon the distance of spacing 153, along with other factors. Depending upon the spacing and voltages involved, the activation of parasitic transistor 205 during an ESD event may lead to substrate damage (e.g. filament formation).

During an ESD event between pads 123 and 121 where pad 123 is at a higher voltage than pad 121, the PNP transistor of device 105 begins to conduct to discharge the charge on pad 123. During such an ESD event, the conduction of the transistor of device 105 pulls the voltage of P well 102 above the voltage of pad 121 (e.g. by 1 volt or more in some examples). The voltage of P well 102 rising above the voltage of pad 121 causes parasitic transistor 205 to conduct current from pad 123 through P+ emitter finger regions (126), N well 111, P well 102, and N well 109, to pad 121.

The conduction of ESD current through parasitic transistor 205 pulls the voltage of N well 111 lower which causes parasitic PNP transistor 207 to conduct. The emitter of parasitic transistor 207 is the P+ emitter regions (131) of device 105, the base is N well 111, and the collector is P well 102. Parasitic transistor 207 conducting may cause potentially damaging current to conduct from P+ emitter regions (131) of device 105 to P well 102. Furthermore, because transistors 205 and 207 are in a thyristor configuration, current flowing through parasitic transistor 207 increases the voltage of P well 102, which increases the conductivity of ESD current through transistor 205, which further increases the current through parasitic transistor 207 in a positive feedback manner. Under certain high voltage conditions of an ESD event, the current through both parasitic transistors 205 and 207 can permanently damage the semiconductor devices as well as substate 101.

Accordingly, in order to inhibit parasitic transistor 205 from conducting, embodiments of the present invention include conductivity reduction features to increase the resistance in a current path to the base electrode of transistor 205 to reduce the current flow from N well 111 to N well 109 and from P+ emitter regions (131) of device 105 to P well 102 during an ESD event.

Figure 3:
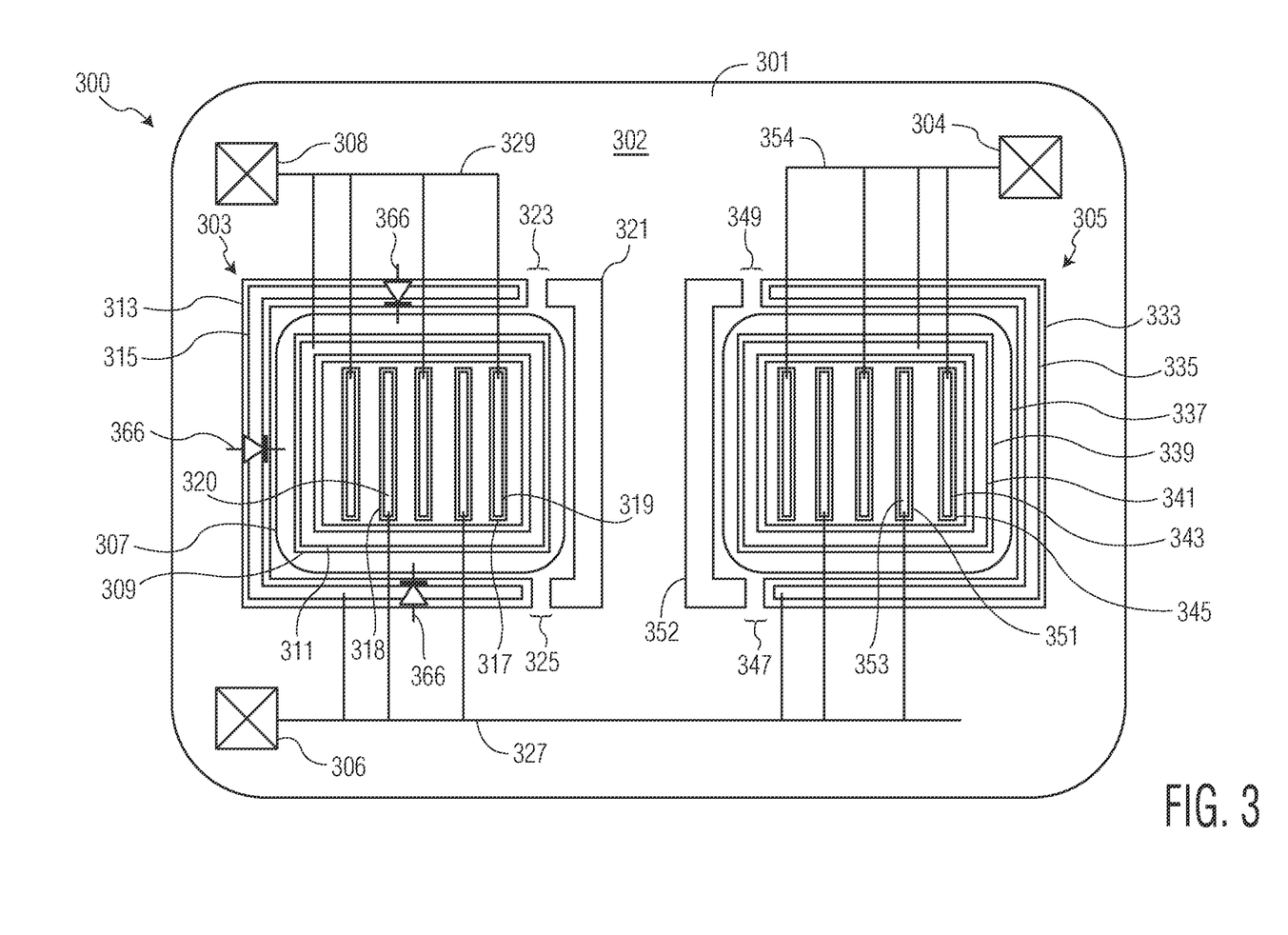
FIG. 3 is a partial top view of an integrated circuit according to one embodiment of the present invention.

FIG. 3 is a partial top view of an integrated circuit 300. The view of FIG. 3 shows two devices 303 and 305 located in substrate 301 of integrated circuit 300. Device 303 is a PNP transistor and device 305 is a PNP transistor that is utilized for discharging current from an Electrostatic Discharge (ESD) event involving pad 304. In other embodiments, 303 and 305 may be other types of devices such as e.g. diodes, poly capacitors, or PFETs. In one embodiment, device 303 is also an ESD device used for discharging ESD current. In other embodiments, device 303 may be utilized for other circuit functions.

In one embodiment, substrate 301 is made of a semiconductor material (e.g. silicon, silicon germanium, gallium nitride) and may include other devices (not shown) located outside the view of FIG. 3. In one embodiment, a P well 302 is formed by the selective ion implantation of P type dopants (e.g. Boron) into substrate 301 during wafer processing. In other embodiments, P well 302 may be in-situ doped during and epitaxial growth. In some embodiments, devices 303 and 305 may be designed to safely operate at voltages above 15V, depending upon the design of integrated circuit 300.

Device 303 includes an N well 307 located in substrate 301. In one embodiment, N well 307 is formed by the selective ion implantation of N-type dopants (phosphorous, arsenic) in substrate 301 such that well 307 has a net N type dopant concentration at a desired level. N well 307 is biased from a pad 308 which is located above the substrate 301 and above one or more interconnect layers (not shown) also located above substrate 301. Pad 308 is electrically connected (via a conductive interconnect 329) to a conductive biasing structure 311 located on a N+ contact region 309 for biasing well 307. The conductive interconnects 329 are represented by a solid line in FIG. 3 and are located in the one or more interconnect layers (not shown) located above substrate 301. N well 307 serves as the base region for the PNP transistor of device 303.

The emitter of the PNP transistor of device 303 is implemented with P+ emitter finger regions (317) in substrate 301 that are biased by pad 308 through interconnects 329 and a conductive structure (319) located on the P+ emitter finger region (317). The collector of the PNP transistor of device 303 is formed by P+ collector finger regions (318) in substrate 301 that are biased by ground pad 306 through interconnects 327 and a conductive biasing structure (320) located on the P+ collector region (318).

Device 305 is a PNP transistor for discharging ESD current from pad 304 during an ESD event. N well 337 forms the base of the PNP transistor and is biased by pad 304, which is connected through interconnect 354 to conductive biasing structure 341, which is connected to N+ contact region 339 in substrate 301.

The emitter of the PNP transistor of device 305 is implemented with P+ emitter finger regions (345) in substrate 301 that are biased by pad 304 through interconnects 354 and a conductive biasing structure (319) located on the P+ emitter finger region (345). The collector of the PNP transistor of device 305 is formed by P+ collector finger regions (351) in substrate 301 that are biased by ground pad 306 through interconnects 327 and a conductive biasing structure (353) located on the P+ collector region (351).

In one embodiment, the conductive biasing structures 315, 320, 319, 311, 353, 343, and 341 are formed on the semiconductor substrate and are in ohmic contact with the underlying semiconductor regions. In some embodiments, the conductive biasing structures are made of one or more metal layers (e.g. copper, aluminum, tungsten) formed on the substrate. The biasing structures may include barrier layers (e.g. titanium nitride, titanium tungsten). Also, the top surface of the semiconductor region beneath the conductive biasing structures may silicided for better electrical contact with the conductive biasing structure. In other embodiments, the conductive biasing structures may be made of other conductive materials such as doped poly silicon.

Conductive Biasing structures are used to effectively bias a semiconductor region from a pad (or other type of integrated circuit terminal such as a bump) by providing a low current path from the pad to the region. The conductive biasing structures are also utilized to provide a low resistance current path between different parts of a same semiconductor region for voltage equalization and current flow.

In order to prevent the activation of a parasitic NPN transistor between N wells 307 and 337 (similar to parasitic transistor 205 of FIG. 2), integrated circuit 300 includes conductivity reduction features for reducing the conductivity between semiconductor regions and external terminals and between different semiconductor regions in substrate. The embodiment of FIG. 3 includes two types of conductivity reduction features that increase the resistance to the base electrode of the parasitic NPN transistor.

Device 303 includes a P+ isolation region 313 and a conductive biasing structure 315 located on top of region 313 for providing electrical isolation of device 303. The combination of region 313 and conductive biasing structure 315 is located on three sides of device 305 (the top, bottom, and left sides relative to the view of FIG. 3). Accordingly, the biasing from pad 306 to region 313 is relatively uniform and there is a relatively low resistance path to all parts of region 313 on three sides of device 303.

As a result of the inclusion of isolation region 313 and conductive structure 315, a relatively strong parasitic diode 366 is formed between P well 302 and N well 307 around the three sides of device 303 (as shown by the diode symbols 366 in FIG. 3).

On the right side (relative to the view shown in FIG. 3) of device 303 at locations corresponding to the location of region 313 on the left side of device 303, two conductivity reduction features inhibit the conductivity of current paths from that location to pad 306 and to the other locations of region 313.

One type of conductivity reduction feature shown are the lower net conductivity doping gaps (both gap 323 and 323) between P+ isolation region 313 and a similar P+ isolation region 321 located on the right side of device 303 (relative to the view shown in FIG. 3). In one embodiment, region 321 is formed during the same selective ion implantation process as region 313. The net P-type dopant concentration of gaps 323 and 325 is that of P well 302, which is lower (e.g. 10-100 times lower) than the net P-type dopant concentration of regions 313 and 321. Gaps 323 and 325 increase the resistance of the current paths from region 321 to region 313 and to pad 306. In some embodiments, gaps 323 and 325 may be formed by an additional N type doping implant into the gap region to lower the net P type doping concentration.

Another type of conductivity reduction feature shown in FIG. 3 is a lack of a conductive biasing structure over region 321. With no conductive biasing structure located over region 321, region 321 is not biased directly by pad 306 nor is there a conductive biasing structure path from region 313 to region 321. According, the conduction path from pad 306 or from region 313 is through relatively lower dopant concentration gaps 323 and 325.

In the embodiment shown, device 305 includes the same conductivity reduction features as device 303. Gaps 349 and 347 separate similarly doped P+ isolation regions 333 and 352. In addition, region 352, which is closer to device 303 than region 333 does not include a conductive biasing structure. However, in other embodiments, device 305 would not include some or all of the conductivity reduction features.

Figure 4:
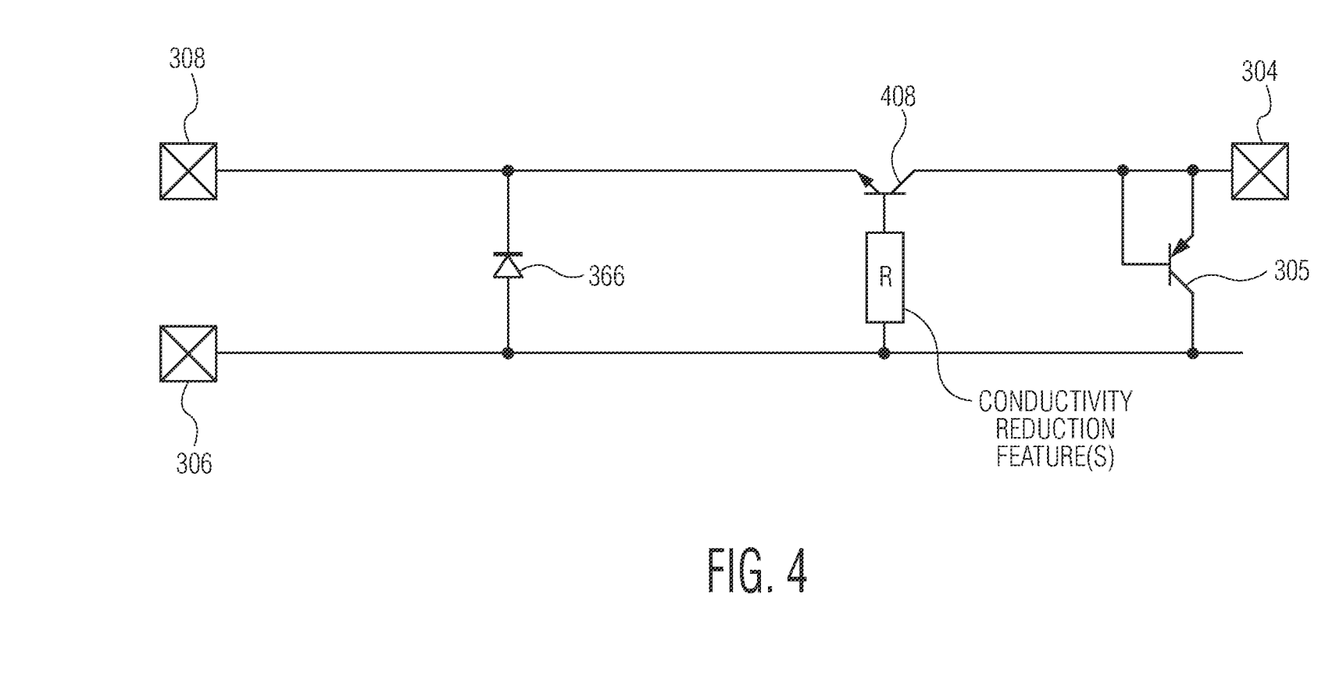
FIG. 4 is a circuit diagram according to one embodiment of the present invention.

FIG. 4 is a circuit diagram of the devices of FIG. 3 showing how the implementation of conductivity reduction features affects the circuit during an ESD event. In FIG. 4, the parasitic NPN transistor 408 represents the NPN transistor where N well 337 is the collector, P well 302 is the base, and N well 307 is the emitter during an ESD event. Not shown in FIG. 4 is the PNP transistor of device 303.

During an ESD event at pad 304 in which pad 304 is at a higher voltage than pad 308, the activation of ESD transistor device 305 pulls up the voltage of P well 302 (which is biased by ground pad 306). However, because of the conductivity reduction features shown in FIG. 3 which are represented as resistance R in FIG. 4, the base emitter current of transistor 408 is significantly reduced due to the to higher resistance to the base electrode. Accordingly, most of the current from the higher voltage P well 302 and pad 306 to the lower voltage pad 308 flows through the parasitic diode 366 of device 303. Because little to no current flows through the base emitter path of NPN parasitic transistor 408, transistor 408 is not activated or only slightly activated. Because parasitic transistor 408 is relatively non active due to the conductivity reduction features, a parasitic PNP transistor of device 305 (not shown in FIG. 4 but similar to parasitic PNP transistor 207 in FIG. 2) also remains relatively inactive. Accordingly, because device 303 implements the conductivity reduction features, the destructive current described earlier with respect to the thyristor of parasitic transistors 205 and 207 of FIG. 2 is significantly reduced.

Figure 5:
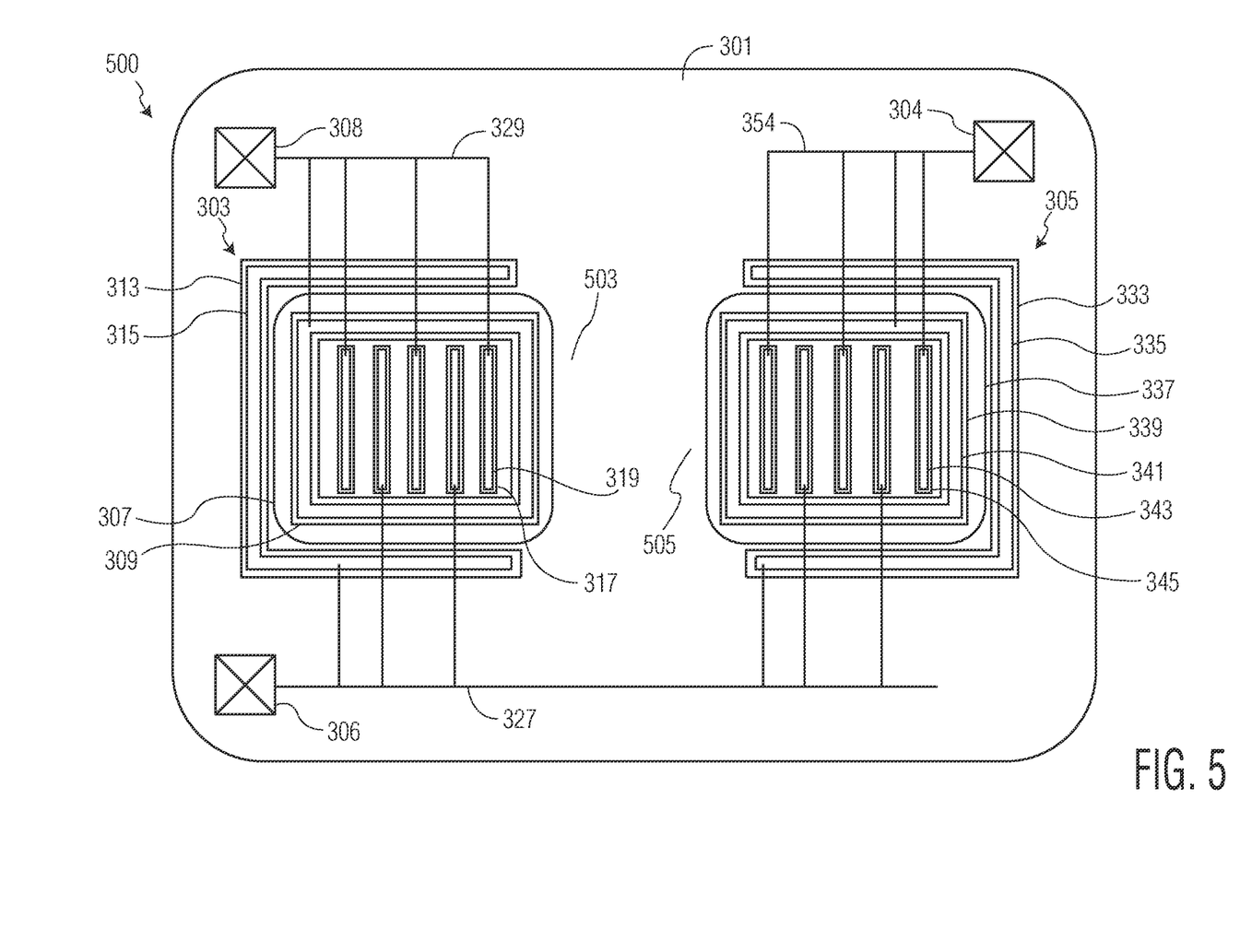
FIG. 5 is a partial top view of an integrated circuit according to another embodiment of the present invention.

FIG. 5 is a partial top view of an integrated circuit 500 according to another embodiment of the present invention. The items of FIG. 5 and the items of FIG. 3 having the same reference numbers are similar.

Integrated circuit 500 includes two types of conductivity reduction features. One type of conductivity reduction feature is to provide a lower net P type doping concentration on the side closest to the other device. Location 503 is a location in substrate 301 on the right side of device 303, relative to the view shown in FIG. 5, that corresponds to the portion of region 313 on the left side of device 305. Location 503 has a lower net P type doping concentration than region 313 due to location 503 not receiving the P+ doping implantation that formed region 313. Likewise, location 505 has a lower net P type doping profile than region 333 of device 305. The lower net P type doping concentration on the sides adjacent to the other device increases the resistance to the base of the parasitic NPN transistor (see transistor 408 of FIG. 4).

The other conductivity reduction feature type shown in FIG. 5 is that no conductive biasing structure is located over locations 503 and 505.

Figure 6:
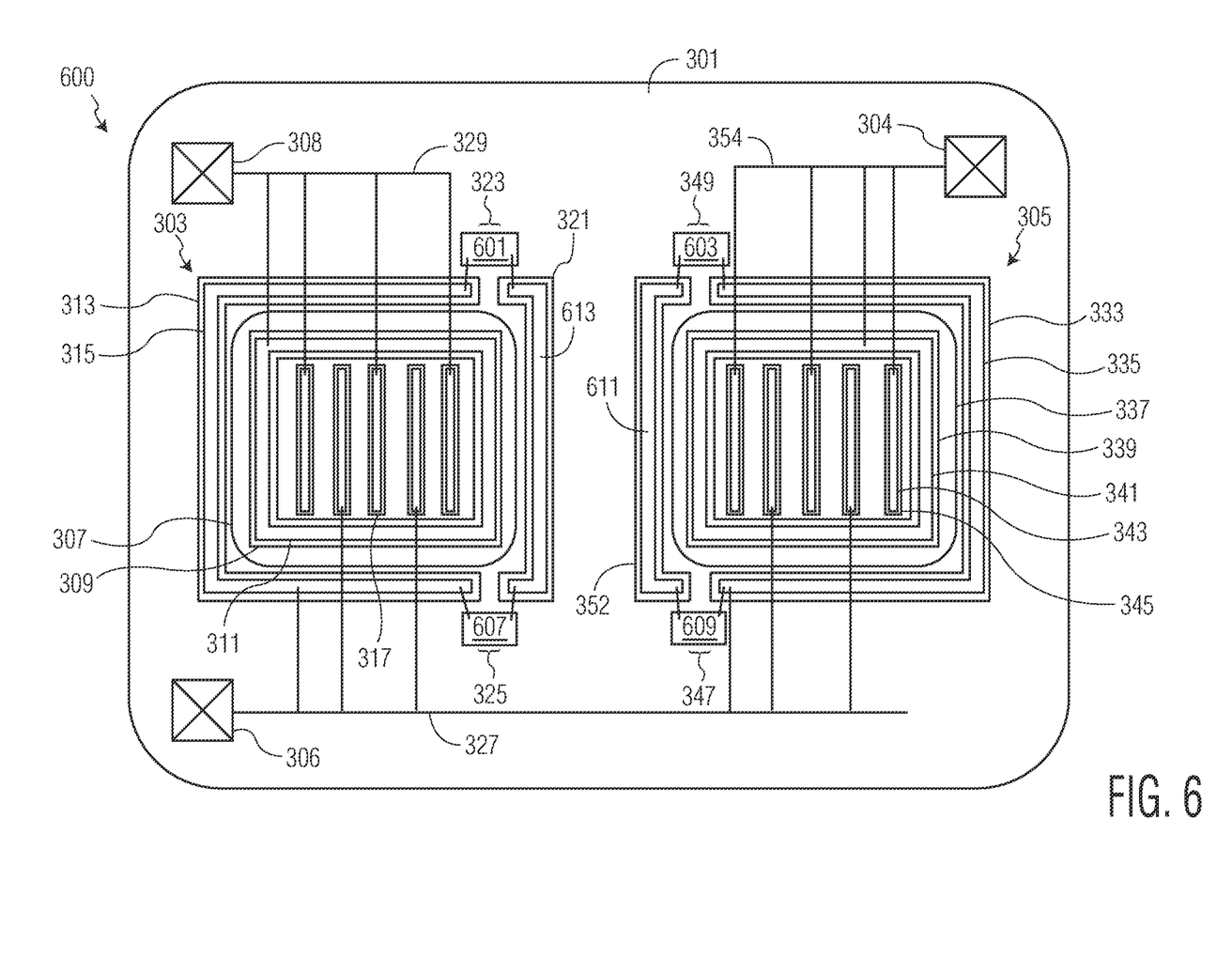
FIG. 6 is a partial top view of an integrated circuit according to another embodiment of the present invention.

FIG. 6 is a partial top view of an integrated circuit 600 according to another embodiment of the present invention. The items of FIG. 6 and the items of FIG. 3 having the same reference numbers are similar.

Similar to integrated circuit 300 of FIG. 3, integrated circuit 600 includes conductivity reducing gaps 323, 325, 345, and 347.

In addition, integrated circuit 600 includes resistors 601 and 607 that couple conductive biasing structure 315 to conductive biasing structure 613. Conductive biasing structure 613 is located on P+ isolation region 321. In one embodiment, resistors 601 and 607 are poly silicon resistors located over substrate 101 outside of the area of device 303. In one embodiment, resistors 601 and 607 are in the range of 10-200 ohms and may be provided with a poly strip having a width in the range of 5-10 um. In other embodiments, resistors 601 and 603 are regions of substrate 101 doped to provide a specific resistance. Device 305 includes resistors 603 and 609 for providing resistance for the coupling of conductive biasing structure 335 to conductive biasing structure 611, which is located on and is in ohmic contact with P+ isolation region 352.

In some embodiments, using resistors to provide resistance in the conductive path between conductive biasing structures may provide for precisely defined resistances in the path to the base of the parasitic NPN transistor (408).

Utilizing conductivity reduction features for reducing the conductivity to a P type region of one device including an N well biased by one pad that is adjacent to another device including an N well biased by a second pad may provide for a mechanism to reduce harmful substrate currents during an ESD event. Such features may provide resistance to the base of a parasitic NPN transistor that includes the two N well regions thereby inhibiting the activation of the parasitic transistor during an ESD event and thereby inhibiting the activation of a parasitic thyristor in the substrate during the ESD event that may cause substrate damaging current. Accordingly, such features may allow for the closer placement of devices having N wells in a substrate without incurring the risk of damage during an ESD event, especially for higher voltage devices (e.g. greater than 15 volts).

Other integrated circuits may have other structures and/or configurations in other embodiments. For example, although the ESD device 305 is a PNP transistor, other types of ESD devices (e.g. diodes) with N wells may be implemented for ESD protection. Furthermore, PNP transistors having other configurations may be used. Also, in some embodiments, a device may only include one type of conductivity reduction feature (e.g. no conductive biasing structure over the region on the side of the device closest to the other device, or only resistors). Also, in some embodiments, an N type region may be located between the two devices (e.g. 303 and 305) at the surface of the substrate. Furthermore, in some embodiments, the ESD device 305 does not include any conductivity reduction features.

Figure 7:
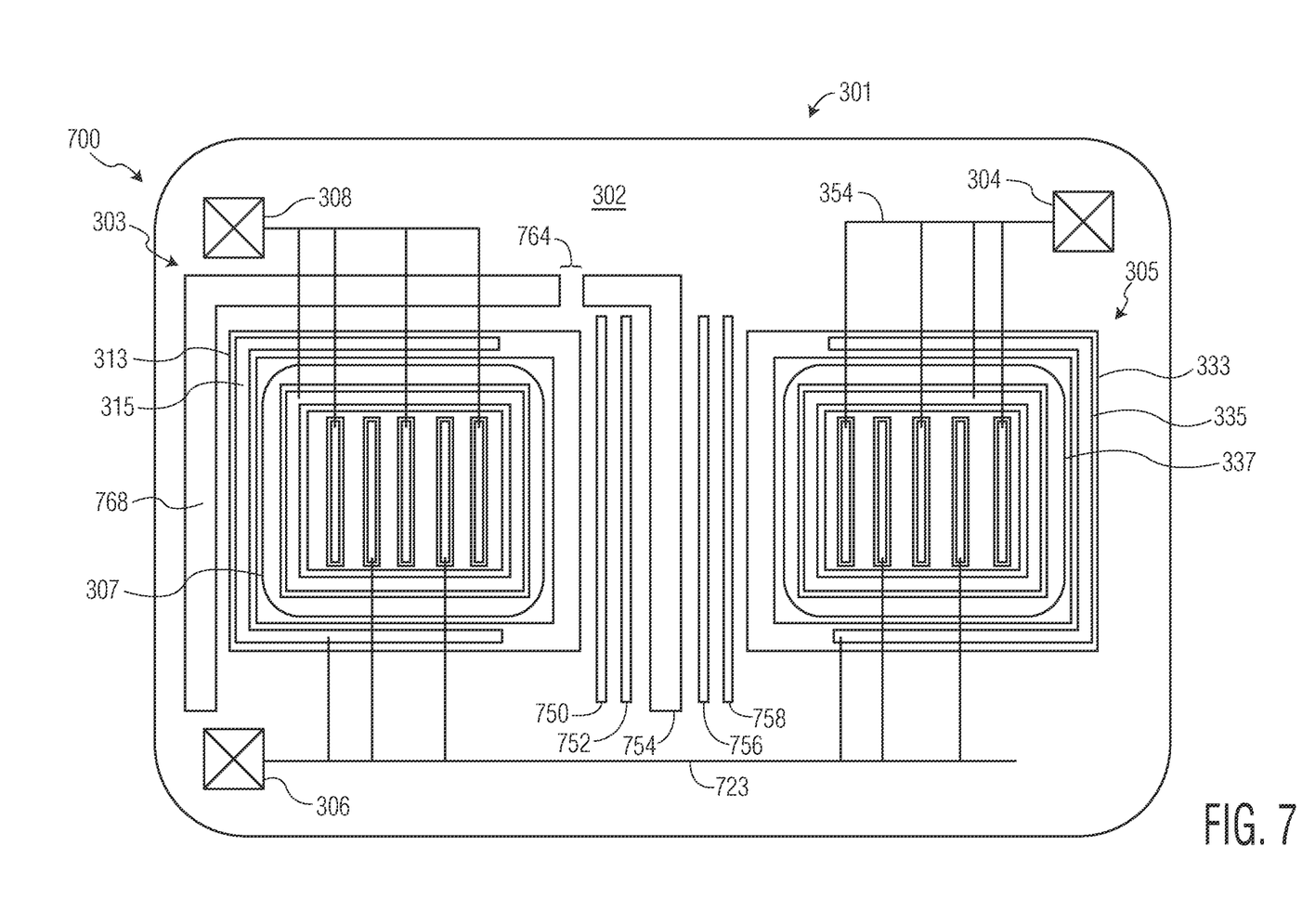
FIG. 7 is a partial top view of an integrated circuit according to another embodiment of the present invention.

As an example, FIG. 7 is a partial top view of an integrated circuit 700 according to another embodiment of the present invention. The items of FIG. 7 and the items of FIG. 3 having the same reference numbers are similar.

In the embodiment of FIG. 7, P+ isolation region 313 surrounds N well 307 including in the area between devices 303 and 305. P+ isolation region 333 surrounds N well 337 including in the area between devices 303 and 305. The conductivity reduction feature in the embodiment of FIG. 7 is that conductive biasing structure 315 is absent over the portion of P+ isolation region 313 on a side that is laterally closest to device 305. Also, conductive biasing structure 335 is absent is over the portion of P+ isolation region 333 on a side that is laterally closest to device 303. Integrated circuit 700 includes P type regions 750 and 758 and N type regions 752 and 756 located between devices 303 and 305. Integrated circuit 700 includes conductive tie biasing structures 768 and 754 which partially surround device 303.

Figure 8:
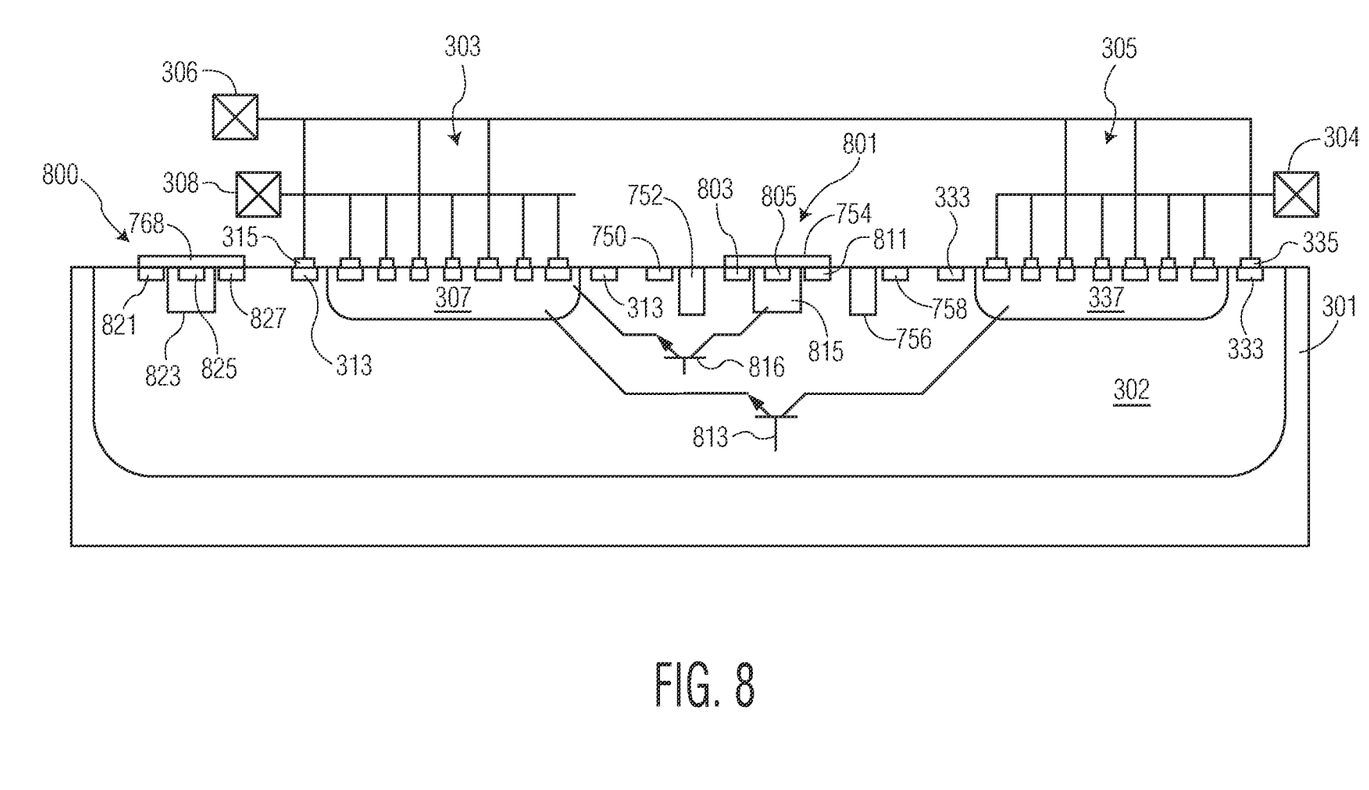
FIG. 8 is a partial cutaway side view of the integrated circuit of FIG. 7 according to another embodiment of the present invention.

FIG. 8 shows a partial cutaway side view of integrated circuit 700. As shown in the view of FIG. 8, conductive tie biasing structure 768 is in electrical contact with P+ regions 821 and 827, N well region 823, and N+ contact region 825 to form minority collector structure 800. Regions 821, 823, 825, and 827 extend under those portions of structure 768 in the view of FIG. 7. Conductive tie biasing structure 754 is in electrical contact with P+ regions 803 and 811, N well region 815, and N+ type contact region 805 to form minority collector structure 800. Regions 803, 805, 815, and 811 extend under those portions of structure 754 in the view of FIG. 7.

During operation, minority charge carriers (e.g. electrons) in P well 302 are collected by N well regions 823 and 815. For each collected electron in the N well region, a hole is taken from an adjacent P+ region (P+ regions 821 and 827 for N well region 823 and P+ regions 803 and 811 for N well region 815) to keep the N well region charge neutral. In this way, the minority carrier collector structures 800 and 801 "convert" electron current into hole current. By collecting in N well regions 823 and 815, the electrons do not pass through to other semiconductor devices (e.g. 305) adjacent to device 303 so as to not interfere with those devices during operation.

As shown in FIG. 8, during an ESD event, a second parasitic bipolar transistor 816 forms in substrate 301 wherein N well region 815 is the emitter P well 302 is the base, and N well 307 is the collector. The current through parasitic transistor 816 reduces the current through parasitic transistor 813.

Referring back to FIG. 7, conductive tie biasing structures 768 and 754 are separated by a gap 764. In addition, tie biasing structures 768 and 754 are not biased by any other conductive biasing structure of integrated circuit 700 or coupled together by another other conductive biasing structures. The regions of substrate 701 beneath tie biasing structure 768 (regions 821, 823, 825, and 827) are not contiguous with the regions of substrate 701 below tie biasing structure 754 (regions 803, 805, 815, and 811). In some embodiments, the fact that conductive tie biasing structure 754 is not connected or electrically coupled with other conductive biasing structures to tie biasing structure 768 may provide for a greater resistance in the base of a parasitic transistor e.g. 813 during an ESD event in that there is no conductive biasing structure path to tie basing structure 768 from tie biasing structure 754. If conductive tie structures 754 and 768 were contiguous or coupled by another conducive biasing structure, then charge from an ESD event may flow from structure 754 to structure 768, and then through P well 302 to region 313 at locations in which tie biasing structure 768 and biasing structure 315 are in close proximity (e.g. the top and left sides of device 303 relative to the view of FIG. 7). Accordingly, a lack of electrical coupling between tie biasing structures 768 and 754 reduces the current path form an area of P well 302 between devices 303 and 305 to ground pad 306 to raise the resistance of the base or a parasitic transistor (e.g. 813) in substrate 301. In some embodiments, tie biasing structure 768 (and collector structure 800) may surround a greater or lessor portion of device 303. For example, in one embodiment, structure 768 may only reside on the top side of device 303 relative to the view of FIG. 7. In other embodiments, tie biasing structure 768 may reside on the top, left, and bottom sides of device 303, relative to the view shown in FIG. 7, depending on the location of other devices on integrated circuit 700. The embodiments FIGS. 3, 4, and 6 may also include carrier collective structures similar to structures 800 and 801 as well.

As used herein, a P type region is a semiconductor region that has a net P type doping concentration such as P well 302 and P+ isolation region 313. An N type region is a semiconductor region that has a net N type doping concentration such as N well 307 and N+ contact region 309. The plus sign (+) after the P or N in the detailed description indicates that the region as a higher net concentration than a region without the "+" designation.

As disclosed herein, a first structure is "directly over" a second structure if the first structure is located over the second structure in a line having a direction that is perpendicular with the generally planar major side of the substrate. For example, in FIG. 2, structure 114 is directly over region 116. Structure 114 is not directly over region 126. As disclosed herein, a first structure is "directly beneath" a second structure if the first structure is located beneath the second structure in a line having a direction that is perpendicular with the generally planar major side of the substrate. For example, in FIG. 2, region 116 is directly beneath structure 114. Region 116 is not directly beneath structure 119. One structure is "directly between" two other structures in a line if the two structures are located on opposite sides of the one structure in the line. For example, in FIG. 2, structure 127 is located directly between structures 119 and 117 in a line in the cut away side view of FIG. 2. Well 109 is not located directly between structure 117 and structure 119 in a line. A first structure is "directly lateral" to a second structure if the first structure and second structure are located in a line having a direction that is parallel with a generally planar major side of the substrate. For example, wells 109 and 111 are directly lateral to each other. Well 109 is not directly lateral to structure 117. One structure is "directly laterally between" two other structures if the two structures are located on opposite sides of the one structure in a line that is parallel with a generally planar major side of the substrate. For example, in FIG. 2, structure 127 is located directly laterally between structures 117 and 119.

Features specifically shown or described with respect to one embodiment set forth herein may be implemented in other embodiments set forth herein.

In one embodiment, an integrated circuit includes a first semiconductor device including a first N type well located in a substrate and includes a first P type region located in the substrate and located at least on a first lateral side of the first N type well and at least partially surrounding the first N type well. The integrated circuit includes a second semiconductor device that is characterized as an ESD device. The second semiconductor device includes a second N type well located in the substrate spaced apart from the first N type well. The substrate includes a first area on a second lateral side of the first N type well opposite to the first lateral side and located in a corresponding area to the first P type region on the first lateral side of the first N type well. The second lateral side of first N type well is a closest lateral side to the second N type well. The integrated circuit includes a conductivity reduction feature that provides a greater resistivity in at least a portion of a current path from a first integrated circuit terminal to the first area than in a current path from the first integrated circuit terminal to the first P type region located on the first lateral side of the first N type well. The integrated circuit includes a first conductive tie biasing structure located directly over an N type region of the substrate and directly over a P type region of the substrate at a second area of the substrate that is located directly laterally between the first area and the second N type well. The first conductive tie biasing structure electrically connects the N type region and the P type region of which it is located directly over. The integrated circuit includes a second conductive tie biasing structure located directly over an N type region of the substrate and directly over an P type region of the substrate at a third area of the substrate. The first P type region is located directly laterally between the third area and the first N type well. The second conductive tie biasing structure electrically connects the N type region and the P type region of which it is located directly over. The first conductive tie biasing structure and the second conductive tie biasing structure are not electrically connected to each other and are not electrically coupled to each other by a conductive biasing structure.

In one embodiment, an integrated circuit includes a first semiconductor device including a first N type well located in a substrate, a first P type region located in the substrate, and a first conductive biasing structure located directly above the first P type region and electrically connected to the first P type region. The first P type region and the first conductive biasing structure located at least on a first lateral side of the first N type well and at least partially surrounding the first N type well to provide a first conductivity level on the first lateral side of the first N type well. The integrated circuit includes a second semiconductor device that is characterized as an ESD device. The second semiconductor device including a second N type well located in the substrate spaced apart from the first N type well. The substrate includes a first area on a second lateral side of the first N type well opposite to the first lateral side and located in a corresponding area to the first P type region on the first lateral side of the first N type well. The second lateral side of first N type well is a closest lateral side to the second N type well. The first semiconductor device includes a conductivity reduction feature for reducing the conductivity from the first conductivity level in a conductive path from the first P type region on the first lateral side of the first N type well to the first area. The integrated circuit includes a first conductive tie biasing structure located directly over an N type region of the substrate and directly over a P type region of the substrate at a second area of the substrate that is located directly laterally between the first area and the second N type well. The first conductive tie biasing structure electrically connects the N type region and the P type region of which it is located directly over. The integrated circuit includes a second conductive tie biasing structure located directly over an N type region of the substrate and directly over an P type region of the substrate at a third area of the substrate. The first P type region is located directly laterally between the third area and the first N type well. The second conductive tie biasing structure electrically connects the N type region and the P type region of which it is located directly over. The first conductive tie biasing structure and the second conductive tie biasing structure are not electrically connected to each other and are not electrically coupled to each other by a conductive biasing structure. The first conductive tie biasing structure and the second conductive tie biasing structure are characterized as partially surrounding the first semiconductor device with at least one gap where the first conductive tie biasing structure does not contact the second conductive tie biasing structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
  a first semiconductor device including:
    a first N type well located in a substrate;
    a first P type region located in the substrate and located at least on a first lateral side of the first N type well and at least partially surrounding the first N type well;
  a second semiconductor device that is characterized as an ESD device, the second semiconductor device including:
    a second N type well located in the substrate spaced apart from the first N type well;
  wherein the substrate includes a first area on a second lateral side of the first N type well opposite to the first lateral side, the first area is located in a corresponding area to an area of the first P type region on the first lateral side of the first N type well, wherein the first N type well is located laterally between the first area and the area of the first P type region on the first lateral side of the first N type well, wherein the second lateral side of first N type well is a closest lateral side to the second N type well;
  a conductivity reduction feature that provides a greater resistivity in at least a portion of a current path from a first integrated circuit terminal to the first area than in a current path from the first integrated circuit terminal to the first P type region located on the first lateral side of the first N type well;
  a first conductive tie biasing structure located directly over an N type region of the substrate and directly over a P type region of the substrate at a second area of the substrate that is located directly laterally between the first area and the second N type well, the first conductive tie biasing structure electrically connects the N type region and the P type region of which it is located directly over;
  a second conductive tie biasing structure located directly over an N type region of the substrate and directly over an P type region of the substrate at a third area of the substrate, the first P type region is located directly laterally between the third area and the first N type well, the second conductive tie biasing structure electrically connects the N type region and the P type region of which it is located directly over;
wherein the first conductive tie biasing structure and the second conductive tie biasing structure are not electrically connected to each other and are not electrically coupled to each other by a conductive biasing structure.

2. The integrated circuit of claim 1 wherein the first conductive tie biasing structure and the second conductive tie biasing structure are characterized as partially surrounding the first semiconductor device with at least one gap where the first conductive tie biasing structure does not contact the second conductive tie biasing structure.

3. The integrated circuit of claim 1 wherein the P type region located directly under the first conductive tie biasing structure and the P type region located directly under the second conductive tie biasing structure are characterized as partially surrounding the first semiconductor device with at least one gap where the P type regions do not contact each other.

4. The integrated circuit of claim 1 wherein the N type region located directly under the first conductive tie biasing structure and the N type region located directly under the second conductive tie biasing structure are characterized as partially surrounding the first semiconductor device with at least one gap where the N type regions do not contact each other.

5. The integrated circuit of claim 1 further comprising:
a first conductive biasing structure located directly above the first P type region and electrically connected to the first P type region, the current path from the first integrated circuit terminal to the first P type region includes the first conductive biasing structure;
wherein the conductivity reduction feature includes a lack of a conductive biasing structure located directly over the first area and electrically connected to the first area.

6. The integrated circuit of claim 1 wherein the conductivity reduction feature includes a dopant concentration reduction discontinuity gap in the substrate between the first P type region located on at least the first lateral side of the first N type well and a second P-type region located in the first area having an equivalent net P type doping concentration to the first P type region.

7. The integrated circuit of claim 1 further comprising:
a first conductive biasing structure located directly above the first P type region and electrically connected to the first P type region, the current path from the first integrated circuit terminal to the first P type region includes the first conductive biasing structure;
a second conductive biasing structure located directly above the first area and electrically connected to the first area, the current path from the first integrated circuit terminal to the first area includes the second conductive biasing structure;
wherein the conductivity reduction feature includes a resistor located in a conductive path between the first conductive biasing structure and the second conductive biasing structure.

8. The integrated circuit of claim 1 wherein the conductivity reduction feature is the first area having a lower net P type doping concentration than the first P type region on the first lateral side of the first N type well.

9. The integrated circuit of claim 1 wherein the first N type well is coupled to be biased by second integrated circuit terminal, the second N type well is coupled to be biased by a third integrated circuit terminal.

10. The integrated circuit of claim 1 wherein:
the second semiconductor device includes a second P type region located in the substrate and located at least on a first lateral side of the second N type well and at least partially surrounding the second N type well;
the substrate includes a fourth area on a second lateral side of the second N type well opposite to the first lateral side and located in a corresponding area to the second P type region on the first lateral side of the second N type well, wherein the second lateral side of second N type well is a closest lateral side to the first N type well;
the integrated circuit further includes a second conductivity reduction feature that provides a greater resistivity in at least a portion of a current path from a first integrated circuit terminal to the fourth area than in a current path from the first integrated circuit terminal to the second P type region located on the first lateral side of the second N type well.

11. The integrated circuit of claim 10 further comprising:
a first conductive biasing structure located directly above the first P type region and electrically connected to the first P type region, the current path from the first integrated circuit terminal to the first P type region includes the first conductive biasing structure;
a second conductive biasing structure located directly above the second P type region and electrically connected to the second P type region, the current path from the first integrated circuit terminal to the second P type region includes the second conductive biasing structure;
wherein the conductivity reduction feature includes a lack of a conductive biasing structure located directly over the first area and electrically connected to the first area;
wherein the second conductivity reduction feature includes a lack of a conductive biasing structure located directly over the fourth area and electrically connected to the fourth area.

12. The integrated circuit of claim 10 wherein:
the conductivity reduction feature includes a dopant concentration reduction discontinuity gap in the substrate between the first P type region located on at least the first lateral side of the first N type well and a third P-type region located in the first area having an equivalent net P type doping concentration to the first P type region;
the second conductivity reduction feature includes a second dopant concentration reduction discontinuity gap in the substrate between the second P type region located on at least the first lateral side of the second N type well and a fourth P-type region located in the fourth area having an equivalent net P type doping concentration to the second P type region.

13. The integrated circuit of claim 10 further comprising:
a first conductive biasing structure located directly above the first P type region and electrically connected to the first P type region, the current path from the first integrated circuit terminal to the first P type region includes the first conductive biasing structure;
a second conductive biasing structure located directly above the first area and electrically connected to the first area, the current path from the first integrated circuit terminal to the first area includes the second conductive biasing structure;
a third conductive biasing structure located directly above the second P type region and electrically connected to the second P type region, the current path from the first integrated circuit terminal to the second P type region includes the third conductive biasing structure;

a fourth conductive biasing structure located directly above the fourth area and electrically connected to the fourth area, the current path from the first integrated circuit terminal to the fourth area includes the fourth conductive biasing structure;

wherein the conductivity reduction feature includes a resistor located in a conductive path between the first conductive biasing structure and the second conductive biasing structure;

wherein the second conductivity reduction feature includes a second resistor located in a conductive path between the third conductive biasing structure and the fourth conductive biasing structure.

14. The integrated circuit of claim 10 wherein the conductivity reduction feature is the first area having a lower net P type doping concentration than the first P type region on the first lateral side of the first N type well and the second conductivity reduction feature is the fourth area having a lower net P type doping concentration than the second P type region on the first lateral side of the second N type well.

15. An integrated circuit comprising:
a first semiconductor device including:
a first N type well located in a substrate;
a first P type region located in the substrate and a first conductive biasing structure located directly above the first P type region and electrically connected to the first P type region, the first P type region and the first conductive biasing structure located at least on a first lateral side of the first N type well and at least partially surrounding the first N type well to provide a first conductivity level on the first lateral side of the first N type well;
a second semiconductor device that is characterized as an ESD device, the second semiconductor device including:
a second N type well located in the substrate spaced apart from the first N type well;
wherein the substrate includes a first area on a second lateral side of the first N type well opposite to the first lateral side, the first area is located in a corresponding area to an area of the first P type region on the first lateral side of the first N type well, wherein the first N type well is located laterally between the first area and the area of the first P type region on the first lateral side of the first N type well, wherein the second lateral side of first N type well is a closest lateral side to the second N type well;
the first semiconductor device including a conductivity reduction feature for reducing the conductivity from the first conductivity level in a conductive path from the first P type region on the first lateral side of the first N type well to the first area;
a first conductive tie biasing structure located directly over an N type region of the substrate and directly over a P type region of the substrate at a second area of the substrate that is located directly laterally between the first area and the second N type well, the first conductive tie biasing structure electrically connects the N type region and the P type region of which it is located directly over;

a second conductive tie biasing structure located directly over an N type region of the substrate and directly over an P type region of the substrate at a third area of the substrate, the first P type region is located directly laterally between the third area and the first N type well, the second conductive tie biasing structure electrically connects the N type region and the P type region of which it is located directly over;

wherein the first conductive tie biasing structure and the second conductive tie biasing structure are not electrically connected to each other and are not electrically coupled to each other by a conductive biasing structure;

wherein the first conductive tie biasing structure and the second conductive tie biasing structure are characterized as partially surrounding the first semiconductor device with at least one gap where the first conductive tie biasing structure does not contact the second conductive tie biasing structure.

16. The integrated circuit of claim 15 wherein the conductivity reduction feature includes a lack of a conductive biasing structure located directly over the first area and electrically connected to the first area.

17. The integrated circuit of claim 15 wherein the conductivity reduction feature includes a dopant concentration reduction discontinuity gap in the substrate between the first P type region located on at least the first lateral side of the first N type well and a second P-type region located in the first area having an equivalent net P type doping concentration to the first P type region.

18. The integrated circuit of claim 15 wherein the conductivity reduction feature includes a resistor located in a conductive path between the first conductive biasing structure located directly above the first P type region and electrically connected to the first P type region located on the first lateral side of the first N type well and a second conductive biasing structure located directly above and electrically connected to the first area.

19. The integrated circuit of claim 15 wherein the conductivity reduction feature is the first area having a lower net P type doping concentration than the first P type region on the first lateral side of the first N type well.

20. The integrated circuit of claim 15 wherein the first P type region is coupled to be biased by a first integrated circuit terminal, the first N type well is coupled to be biased by a second integrated circuit terminal, and the second N type well is coupled to be biased by a third integrated circuit terminal.

* * * * *